US012562723B2

(12) United States Patent
Sivero

(10) Patent No.: US 12,562,723 B2
(45) Date of Patent: Feb. 24, 2026

(54) PROGRAMMABLE DELAYS AND METHODS THEREOF

(71) Applicant: Ferroelectric Memory GmbH, Dresden (DE)

(72) Inventor: Stefano Sivero, Comun Nuovo (IT)

(73) Assignee: Ferroelectric Memory GmbH, Dresden (DE)

( * ) Notice: Subject to any disclaimer, the term of this patent is extended or adjusted under 35 U.S.C. 154(b) by 45 days.

(21) Appl. No.: 17/648,788

(22) Filed: Jan. 24, 2022

(65) Prior Publication Data

US 2023/0238948 A1     Jul. 27, 2023

(51) Int. Cl.
| | |
|---|---|
| *H03K 5/134* | (2014.01) |
| *G11C 7/00* | (2006.01) |
| *G11C 8/00* | (2006.01) |
| *G11C 16/00* | (2006.01) |
| *H03K 5/00* | (2006.01) |

(52) U.S. Cl.
CPC .............. *H03K 5/134* (2014.07); *G11C 7/00* (2013.01); *G11C 8/00* (2013.01); *G11C 16/00* (2013.01); *H03K 2005/00019* (2013.01); *H03K 2005/00195* (2013.01)

(58) Field of Classification Search
CPC ......... H03K 5/134; H03K 2005/00019; H03K 2005/00195; G11C 7/00; G11C 8/00; G11C 16/00
See application file for complete search history.

(56) References Cited

U.S. PATENT DOCUMENTS

| | | | | |
|---|---|---|---|---|
| 5,051,630 A * | 9/1991 | Kogan | ................... | H03K 5/133 327/264 |
| 9,997,227 B2 * | 6/2018 | Morris | ................ | G11C 11/2297 |
| 10,978,129 B1 | 4/2021 | Müller | | |
| 11,081,159 B1 | 8/2021 | Jähne et al. | | |
| 11,189,331 B1 | 11/2021 | Benoist et al. | | |
| 11,195,589 B1 | 12/2021 | Ocker et al. | | |
| 11,289,145 B2 | 3/2022 | Ocker | | |
| 11,393,518 B1 | 7/2022 | Ocker | | |
| 11,443,792 B1 | 9/2022 | Iqbal et al. | | |
| 11,475,935 B1 | 10/2022 | Ocker | | |
| 11,508,426 B1 | 11/2022 | Ocker | | |
| 2008/0246516 A1 * | 10/2008 | Hoang | ................. | H03D 13/004 327/12 |

(Continued)

FOREIGN PATENT DOCUMENTS

| | | | | | |
|---|---|---|---|---|---|
| CN | 113903378 A | * | 1/2022 | ............. | G06N 3/063 |
| JP | 2006237143 A | * | 9/2006 | | |

*Primary Examiner* — Lincoln D Donovan
*Assistant Examiner* — James G Yeaman
(74) *Attorney, Agent, or Firm* — Natalie Albrecht

(57) ABSTRACT

Disclosed herein is a programmable delay circuit for providing an adjustable delay for a signal transmitted from an input node to an output node. The adjustable delay circuit includes an input node; an output node; and a pair of inverter circuits coupled in series between the input node and the output node, wherein the pair of inverter circuits is configured to provide an adjustable delay for a signal transmitted from the input node to the output node. At least one inverter circuit of the pair of inverter circuits includes a state-programmable memory element that allows the pair of inverter circuits to be configurable between a first delay mode or a second delay mode.

8 Claims, 6 Drawing Sheets

(56)     References Cited

U.S. PATENT DOCUMENTS

| | | | |
|---|---|---|---|
| 2014/0077857 A1* | 3/2014 | Poulton | H03K 5/133 |
| | | | 327/278 |
| 2017/0178711 A1* | 6/2017 | Morris | G11C 11/2297 |
| 2019/0130956 A1 | 5/2019 | Müller et al. | |
| 2019/0130957 A1 | 5/2019 | Müller | |
| 2019/0325963 A1 | 10/2019 | Noack | |
| 2020/0027493 A1 | 1/2020 | Müller et al. | |
| 2020/0357455 A1 | 11/2020 | Noack et al. | |
| 2020/0357470 A1 | 11/2020 | Noack | |
| 2021/0005238 A1 | 1/2021 | Müller | |
| 2021/0082958 A1 | 3/2021 | Mennenga et al. | |
| 2021/0090662 A1 | 3/2021 | Mennenga et al. | |
| 2021/0091097 A1 | 3/2021 | Mennenga | |
| 2021/0125656 A1 | 4/2021 | Müller | |
| 2021/0217454 A1 | 7/2021 | Ocker | |
| 2021/0312969 A1 | 10/2021 | Noack et al. | |
| 2021/0327901 A1 | 10/2021 | Noack | |
| 2021/0336534 A1 | 10/2021 | Iqbal et al. | |
| 2022/0020776 A1 | 1/2022 | Mennenga et al. | |
| 2022/0060105 A1 | 2/2022 | Iqbal | |
| 2022/0122995 A1 | 4/2022 | Ocker et al. | |
| 2022/0122996 A1 | 4/2022 | Ocker et al. | |
| 2022/0122999 A1 | 4/2022 | Polakowski | |
| 2022/0139437 A1 | 5/2022 | Ocker | |
| 2022/0139931 A1 | 5/2022 | Ocker | |
| 2022/0139932 A1 | 5/2022 | Polakowski | |
| 2022/0139933 A1 | 5/2022 | Noack | |
| 2022/0139934 A1 | 5/2022 | Muller | |
| 2022/0139936 A1 | 5/2022 | Ocker | |
| 2022/0139937 A1 | 5/2022 | Müller et al. | |
| 2022/0172791 A1 | 6/2022 | Schenk | |
| 2022/0173114 A1 | 6/2022 | Schenk | |
| 2022/0189524 A1 | 6/2022 | Ocker | |
| 2022/0199166 A1 | 6/2022 | Mennenga et al. | |
| 2022/0270659 A1 | 8/2022 | Ocker | |
| 2022/0277794 A1 | 9/2022 | Noack | |
| 2022/0374202 A1 | 11/2022 | Villa et al. | |
| 2022/0376114 A1 | 11/2022 | Müller | |
| 2023/0041759 A1 | 2/2023 | Noack et al. | |
| 2023/0046259 A1 | 2/2023 | Iqbal | |
| 2023/0135718 A1 | 5/2023 | Minh et al. | |
| 2023/0170029 A1 | 6/2023 | Sivero | |
| 2023/0189531 A1 | 6/2023 | Muller | |
| 2023/0189532 A1 | 6/2023 | Muller | |
| 2023/0223066 A1 | 7/2023 | Muller | |
| 2023/0247842 A1 | 8/2023 | Muller | |
| 2023/0284454 A1 | 9/2023 | Ocker et al. | |
| 2023/0335174 A1 | 10/2023 | Kuzmanov | |
| 2023/0360684 A1 | 11/2023 | Sivero | |
| 2023/0371268 A1 | 11/2023 | Muller | |

* cited by examiner

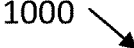

1000

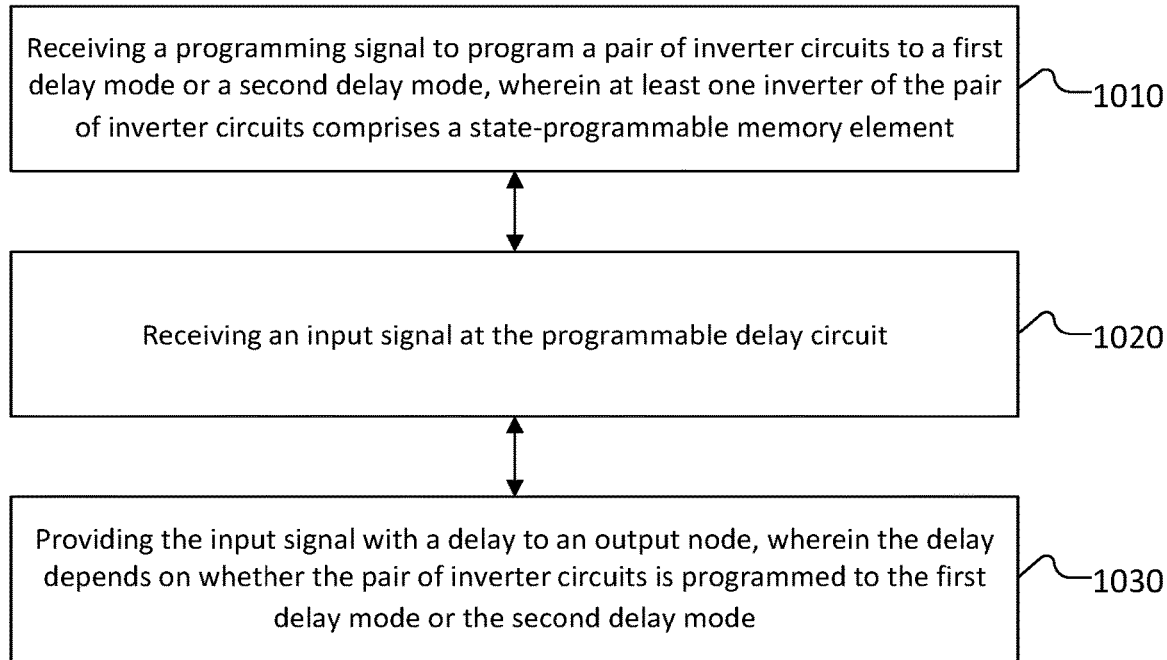

Receiving a programming signal to program a pair of inverter circuits to a first delay mode or a second delay mode, wherein at least one inverter of the pair of inverter circuits comprises a state-programmable memory element ⟿─1010

Receiving an input signal at the programmable delay circuit ⟿─1020

Providing the input signal with a delay to an output node, wherein the delay depends on whether the pair of inverter circuits is programmed to the first delay mode or the second delay mode ⟿─1030

FIG. 10

PROGRAMMABLE DELAYS AND METHODS THEREOF

TECHNICAL FIELD

Various aspects are related to circuits, and in particular, to programmable delays for analog and digital circuits and methods thereof, e.g., a method of operating a programmable delay circuit.

BACKGROUND

Delays are widely used in both analog circuits and digital circuits to delay a signal. In general, a delay circuit receives an applied signal as an input and transmits the applied signal to the output with a time delay. Often, the time delay between input and output may need to be adjusted (e.g., trimmed) in order to adapt the delay time for the particular application or as conditions change. Typically, to achieve different delay times, a set of dedicated resources (e.g., additional chip real-estate for dedicated transistors, capacitors, silicon area, control signal routing, and/or metal) are required for each different delay time that may be selected. As a result, providing an adjustable delay may be costly, especially from the perspective of otherwise scarce on-chip resources.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects of the invention are described with reference to the following drawings, in which:

FIG. 10 depicts an exemplary schematic flow diagram of a method for operating a programmable delay circuit.

DESCRIPTION

Figure 1:
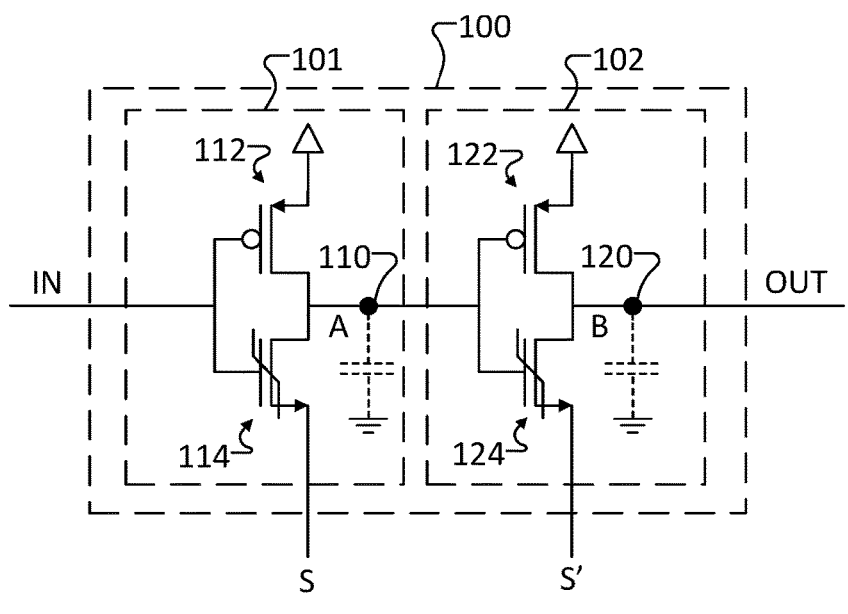
FIG. 1 shows an exemplary programmable delay circuit in a schematic view.

The following detailed description refers to the accompanying drawings that show, by way of illustration, specific details and aspects in which the invention may be practiced. These aspects are described in sufficient detail to enable those skilled in the art to practice the invention. Other aspects may be utilized, and structural, logical, and electrical changes may be made without departing from the scope of the invention. The various aspects are not necessarily mutually exclusive, as some aspects may be combined with one or more other aspects to form new aspects. Various aspects are described in connection with methods and various aspects are described in connection with devices (e.g., a regulator circuit, a memory circuit, or a system including a regulator circuit and an array of memory cells). However, it may be understood that aspects described in connection with methods may similarly apply to the devices, and vice versa.

In general, a delay circuit receives an applied signal at an input and transmits the applied signal to the output with a time delay. To provide an adjustable time delay (i.e., trimmable), prior solutions typically required a set of dedicated resources (e.g., additional chip real-estate for dedicated transistors, capacitors, area, control signal routing, and/or metal) for each different delay time that may be provided. As a result, providing an adjustable delay may be costly, especially from the perspective of on-chip resources. By contrast, the programmable delay circuit described in more detail below may provide a programmable delay without the need for additional chip-resources for the dedicated transistors, capacitors (which may cost area and/or control signal routing), or even metal options (which require a new mask set) for each selectable delay. The programmable delay circuit described below may include a state-programmable memory element (e.g., an element that is spontaneously polarizable, e.g., an element that is remanent polarizable (e.g., a ferroelectric element)). For example, the state-programmable memory element may be a state-programmable field-effect transistor, e.g., a ferroelectric field-effect transistor (FeFET). As an example, a FeFET may include state-programmable material (e.g., a ferroelectric material) as a gate insulator of the field-effect transistor. As another example, the FeFET may include a field-effect transistor with a state-programmable capacitor (e.g., a remanent polarizable capacitor such as a ferroelectric capacitor) coupled to a gate electrode. Because a state-programmable memory element that is spontaneously polarizable may be programmed to at least two stable polarization states, the polarization states may be used to shift a threshold voltage of the FeFET in a non-volatile fashion, allowing the FeFET to retain the programmed polarization state even after the voltage is removed. Although reference is made herein to a FeFET, the aspects described herein may not be limited to a ferroelectric field-effect transistor and the term state-programmable memory element should be understood, in some aspects, to include any type of field-effect transistor that is state-programmable. More broadly, a FeFET is merely one example of a state-programmable memory element, and as used herein a state-programmable memory element should be understood to encompass any type of circuit element that is state-programmable (e.g., to a remanent polarization state). However, a FeFET may be a type of state-programmable memory element that can be efficiently integrated into a complementary metal oxide semiconductor (CMOS) circuit.

In general, a remanent polarization (also referred to as retentivity or remanence) may be present in a material layer such that the material layer may remain polarized upon reduction of an applied electric field (E) to zero; therefore, a certain value for the electrical polarization (P) of the material layer may be detected. Illustratively, a polarization remaining in a material, when the electric field is reduced to zero, may be referred to as remanent polarization. Therefore, the remenance of a material may be a measure of the residual polarization in the material in the case that an applied electric field is removed. In general, ferroelectricity and anti-ferroelectricity may be concepts to describe a remanent polarization of a material similar to ferromagnetism and anti-ferromagnetism used to described remanent magnetization in magnetic materials.

Further, the term spontaneously polarized or spontaneous polarization may be used with reference to a residual polarization, e.g., the polarization capability of a material beyond dielectric polarization. The coercivity of a material may be a measure of the strength of the reverse polarizing electric field that may be required to remove a remanent polarization. A remanent polarization may be evaluated via analyzing one or more hysteresis measurements (e.g., hysteresis curves), e.g., in a plot of P versus E, in which the material is polarized into opposite directions. A polarization capability of a state-programmable memory element (e.g., remanent polarization capability, e.g., non-remanent spontaneous polarization capability) may be analyzed using capacity measurements (e.g., a spectroscopy), e.g., via a static (C-V) and/or time-resolved measurement or by polarization-voltage (P-V) or positive-up-negative-down (PUND) measurements. Another method for determining a polarization capability of a state-programmable memory element may include transmission electron microscopy, e.g., an electric-field dependent transmission electron microscopy.

In operation, a state-programmable memory element such as a FeFET may be configured such that an electrical behavior (e.g., current flow) of the output node (e.g., the source and/or drain) may be controlled via a voltage at an input node (e.g., the gate). In other words, the electrical current flow at the source and/or drain output nodes may be varied by varying the gate voltage. Such a FeFET may include a first state (e.g., a high threshold voltage state (HVT)) and a second state (e.g., a low threshold voltage state (LVT)) that may be switched by changing the remanent polarization of the state programmable memory element. For example, to change the remanent polarization of a FeFET, a voltage may be applied across the FeFET (e.g., between the gate and the source/drain) that is substantially equal to or greater than the programming voltage need to program the corresponding state. The programming voltage may be selected so that a predefined remanent polarization of the state programmable memory element is achieved with the programming voltage. Often, the terms "erasing" or "programming" are used to describe changing the state (e.g., a memory state) of a state-programmable memory element such as a FeFET. For example, "erasing" may be understood as writing a logic "0" or changing the FeFET's state to the HVT state, while "programming" may be understood as writing a logic "1" or changing the FeFET's state to the LVT state. As should be appreciated, however, the nomenclature for the first/second states, the associated logic bit values, and/or the associated terms "programming" and "erasing" may be selected arbitrarily.

Depending on the programmed state of the state-programmable memory element (e.g., whether the FeFET is programmed to the LVT or HVT state), the state-programmable memory element may exhibit different drive capabilities for charging a load capacitance at its drain. For example, if the FeFET is in a first state (e.g., an HVT state) the FeFET may have a weaker drive capability to discharge the load capacitance, while if the FeFET is in a second state (e.g., an LVT state), the FeFET may have a stronger drive capability to discharge the load capacitance. As described in more detail below, a delay circuit that uses such a FeFET may be programmable with an adjustable delay that depends on the programming state of the FeFET. In this manner, the disclosed programmable delay circuit described in more detail below may provide a programmable delay (e.g., different delay times) without the need for additional chip-resources for the dedicated transistors, capacitors (which may cost area and/or control signal routing), or even metal options (which require a new mask set) for each selectable delay. In addition, the programmable delay circuit described below may be advantageous because it may be integrated directly into the logic circuit or analog circuit for which the delay is being provided. While the particular examples herein have been described with respect to two states (e.g., the HVT and LVT state of a FeFET), as noted earlier, a state-programmable memory element may be programmed to more than two states. As such, it should be appreciated that a state-programmable memory element may be programmed to more than two states (e.g., three states, four states, etc.), where each state may correspond to different charging times, such that the corresponding delays may be fine-tuned.

As used herein, the term "voltage" may be used with respect to "a supply voltage", "an input voltage," "an output voltage," and the like. As an example, the term "supply voltage" may be used herein to denote a voltage provided to a circuit for operating the circuit components (e.g., for operating the logic components of a logic circuit). As another example, the "input voltage" may be the voltage level at an input node of circuit and the "output voltage" may be the voltage level at an output node of a circuit. The "voltage across" a component may be used herein to denote a voltage drop from a node on one side of a component (e.g., a gate of a transistor) to a node on the other side of the component (e.g., a source/drain of the transistor).

FIG. 1 shows a programmable delay circuit 100 for providing an adjustable delay. Programmable delay circuit 100 may provide a delay to a signal applied to the input node (e.g., "IN") by transmitting it to the output node (e.g., "OUT") after a time delay. Programmable delay circuit 100 may be programmed to different delay modes, including, for example, to provide a first delay mode in which there is a delay on the rising edge of an input signal or to provide a second delay mode in which there is a delay on the falling edge of an input signal. In addition, the programmable delay circuit 100 may provide a first delay mode in which there is a delay on either the rising edge or the falling edge and, in the second delay mode, no additional delay is provided to the input signal. Thus, programmable delay circuit 100 may be programmed to provide two different delays (e.g., different delays that depend on whether the delay circuit is programmed to the first mode or second mode).

To provide a programmable delay, programmable delay circuit 100 may include a pair of inverter circuits (e.g., inverter circuits 101 and 102) between the input and the output, where at least one inverter circuit may include a field-effect transistor with a state-programmable memory element (e.g., a FeFET). As shown in the exemplary embodiment of FIG. 1, for example, a first inverter circuit 101 may be connected to the input and may include a field-effect transistor 112 connected in series with a state-programmable memory element 114. The drains of the field-effect transistor 112 and the state-programmable memory element 114 may be connected together (e.g., at node A), which may also serve as the input node to a second inverter circuit 102. The second inverter circuit 102 may include a field-effect transistor 122 connected in series with a state-programmable memory element 124. As with the first inverter circuit 101, the drains of the field-effect transistor 122 and the state-programmable memory element 124 of the second inverter circuit 102 may be connected together (e.g., at node B), which may also serve as the output of node of programmable delay circuit 100.

As should be appreciated, an inverter circuit may include two transistor elements (e.g., a p-type transistor element connected in series with an n-type transistor element), and although the inverter circuits described herein (e.g., 101, 102) have been depicted so that the n-type transistor element is a state programmable memory element (e.g., 114, 124 are n-type FeFETs) and the p-type transistor element is a conventional p-type field-effect transistor (e.g., 112, 122), other configurations are possible, where, for example, either or both transistor elements of the inverter circuit are state-programmable memory elements. For example, the two transistor elements of the inverter circuits described herein may be in a complementary configuration (e.g., when the n-type transistor element is a conventional n-type field-effect transistor, then the p-type transistor element is a state programmable memory element (e.g., a p-type FeFET), or when the p-type transistor element is a conventional p-type field-effect transistor, then the n-type transistor element is a state programmable memory element (e.g., an n-type FeFET)). Applying this complementary configuration concept to inverter circuit 101, for example, it may instead include a p-type FeFET (e.g., in place of 112) connected with a conventional n-type field-effect transistor (in place of 114). Alternatively, the two transistor elements of the inverter circuits described herein may both be state pro-gramming memory elements. Applying this to inverter circuit 101, for example, it may include a p-type FeFET (e.g., in place of 112) connected with a n-type FeFET (e.g., 114). Thus, while the figures and associated descriptions herein may depict inverter circuits with the n-type transistor element as the state programmable memory element, this is not limiting, and the descriptions should be appreciated by one of skill in the art to be equally applicable to inverter circuits where either or both of the transistor elements (e.g., the n-type transistor element and the p-type transistor element) are state programmable memory elements.

The delay provided by programmable delay circuit 100 may be programmed based on the respective programming states of the state-programmable memory elements 114, 124. For example, state-programmable memory element 114 may be programmed to a first programming state associated with a weak ability to discharge a load capacitance (e.g., it discharges capacitance slowly) at the output node of the state-programmable memory element 114 (e.g., node A (110) at the drain of state-programmable memory element 114), while state-programmable memory element 124 may be programmed to a second programming state associated with a strong ability to discharge a load capacitance (e.g., it discharges capacitance quickly) at the output node of state-programmable memory element 124 (e.g., node B (120), connected to the drain of state-programmable memory element 124). Or vice-versa, where state-programmable memory element 114 may be programmed to the second programming state while state-programmable memory element 124 may be programmed to first programming state. With such a configuration, programmable delay circuit 100 may provide a longer delay on one edge of the input signal (e.g., a delay on a rising edge or a falling edge) while providing a shorter delay on the other edge.

While FIG. 1 shows that each inverter circuit of the pair of inverter circuits includes a state-programmable memory element, it should be appreciated that only one inverter circuit of the pair of inverter circuits may include a state-programmable memory element to provide the delay. In such a case, the programmable delay circuit 100 may provide in a first mode a delay on one edge of the input signal (e.g., a delay on a rising edge or a falling edge, depending on whether the first or second inverter includes the state-programmable memory element), and in a second mode, no additional delay. When only one state-programmable memory element is used, whether the rising edge or the falling edge is delayed depends on whether the first inverter circuit or the second inverter circuit includes the state-programmable memory element. Thus, in the first mode, the state-programmable memory element may be programmed to a first programming state associated with a weak ability to discharge a load capacitance, and the programmable delay circuit 100 may thus provide a delay (e.g., on either the rising or falling edge, depending on whether the state-programmable memory is the first or second inverter of the pair). And, in a second mode, the state-programmable memory element may be programmed to a second program-ming state associated with a strong ability to discharge a load capacitance, and the programmable delay circuit 100 may thus provide essentially no delay (e.g., on neither the rising edge nor the falling edge).

Using a FeFET as a particular example of the state-programmable memory elements 114, 124 of FIG. 1, the first programming state may be associated with the HVT state of the FeFET, where, when the FeFET is programmed to the HVT state, the FeFET may slowly discharge a load capaci-tance at the drain of the FeFET. The second programming state may be associated with the LVT state of the FeFET, where, when the FeFET is programmed to the LVT state, the FeFET may quickly discharge a load capacitance at the drain of the FeFET. As should be appreciated, the FeFET of the first inverter circuit 101 may be programmed to a different programming state than the FeFET of the second inverter circuit 102. Thus, when the state-programmable memory element 114 of the first inverter circuit 101 is programmed to the HVT state, the rising edge of the input signal may be delayed. And when the state-programmable memory ele-ment 124 of the second inverter circuit 102 is programmed to the HVT state, the falling edge of the input signal may be delayed. Said differently, the delay provided by program-mable delay circuit 100 may be programmed to be on the rising edge or the falling edge, depending on whether the state-programmable memory element of the first inverter circuit 101 or the second inverter circuit 102 is programmed to the HVT state (and of course, depending on whether it is n-type or p-type). Regardless of which edge is programmed to have the added delay, the added delay may be based on the time it takes for the FeFET programmed to the HVT state to discharge the load capacitance of its drain.

Programmable delay circuit 100 may be designed to operate at logic voltage levels such that the voltage level (e.g., the input voltage, output voltage, etc.) may be asso-ciated with a first logic level (e.g., "1" or "high" or $V_{DD}$) and may have a second logic level (e.g., "0" or "low" or zero volts). The logic voltage may also be the supply voltage level for the logic elements (e.g., the supply voltage at the source of field-effect transistors 112, 122). While any volt-age levels may be select for the logic level and/or to supply the logic elements, it is important that the logic level associated with the normal operation of the programmable delay circuit 100 be selected so as to not impact the programmed states of the state-programmable memory ele-ments 114, 124. Said differently, during normal operation of programmable delay circuit 100, the voltage across each state-programmable memory element 114, 124 should not exceed the programming voltage needed to change the programmed state (e.g., the remanent polarization state). As noted above, if the magnitude of the voltage across the state-programmable memory element (e.g., between the gate and the source/drain of the FeFET) is substantially equal to or greater than the programming voltage, the state-programmable memory element will be programmed (or re-programmed) to the corresponding programmed state. As also noted above, the terms "erasing" or "programming" may be used to describe programming a state-programmable memory element to one of two corresponding programmed states, where "erasing" may be associated with a first state, and "programming" may be associated with a second state.

To ensure that the normal operation does not exceed the programming voltage, the logic voltage may be selected with a magnitude that is lower than the programming voltages (e.g., "erase" or "program" voltages) for the state-programmable memory elements 114, 124. For example, if the logic voltage is $V_{DD}$, the magnitude of the programming voltages may be much higher, e.g., $3/2 V_{DD}$, such that the logic voltages of normal operation (e.g., zero volts to $V_{DD}$) do not approach the programming voltage. Using programmable delay circuit 100 as an example, the supply voltage may be $V_{DD}$, (e.g., where $V_{DD}$ is the "high" logic level for the input/output voltage and the voltage across inverter circuits 101, 102). For normal operation, the supply voltage at the source terminal of field-effect transistors 112, 122 may be set to $V_{DD}$, while the source terminals of the state-programmable memory elements 114, 124 (e.g., S and S', respectively) may be set to zero volts. This means that during normal operation the voltages at the input, output, and intermediate nodes A, B will fluctuate between zero and $V_{DD}$, and the magnitude of the voltage across the state-programmable memory elements 114, 124 will not exceed the programming voltage of $$\frac{3}{2} V_{DD}.$$

To program programmable delay circuit 100, a non-zero voltage may be applied to the source terminals of the state-programmable memory elements 114, 124 (e.g., at S and S'). For example, applying $$-\frac{1}{2} V_{DD} \text{ to } S,$$

$V_{DD}$ to S', and $V_{DD}$ to the input voltage, the voltage across state-programmable memory element 114 (e.g., from gate to source) will be $$\frac{3}{2} V_{DD}$$

and the voltage across state-programmable memory element 124 will be $$-\frac{3}{2} V_{DD}.$$

Assuming $$\frac{3}{2} V_{DD}$$

and $$-\frac{3}{2} V_{DD}$$

exceed the programming voltages for state-programmable memory elements 114, 124, they will be programmed to their corresponding states. For example, state-programmable memory element 114 may be programmed to a second programming state (e.g., $$\frac{3}{2} V_{DD}$$

to "program" the FeFET to the LVT state) and state-programmable memory element 124 may be programmed to a first programming state (e.g., $$-\frac{3}{2} V_{DD}$$

to "erase" the FeFET to the HVT state). On the other hand, applying $V_{DD}$ to S, $$-\frac{1}{2} V_{DD}$$

to S' and $$-\frac{1}{2} V_{DD}$$

to the input voltage will have the opposite effect, where the voltage across state-programmable memory element 114 (e.g., from gate to source) will be $$-\frac{3}{2} V_{DD}$$

and the voltage across state-programmable memory element 124 will be $$\frac{3}{2} V_{DD}.$$

These voltages may be sufficient to program state-programmable memory element 114 to the first programming state (e.g., to "erase" the FeFET to the HVT state) and to program state-programmable memory element 124 to the second programming state (e.g., to "program" the FeFET to the LVT state).

Figure 2:
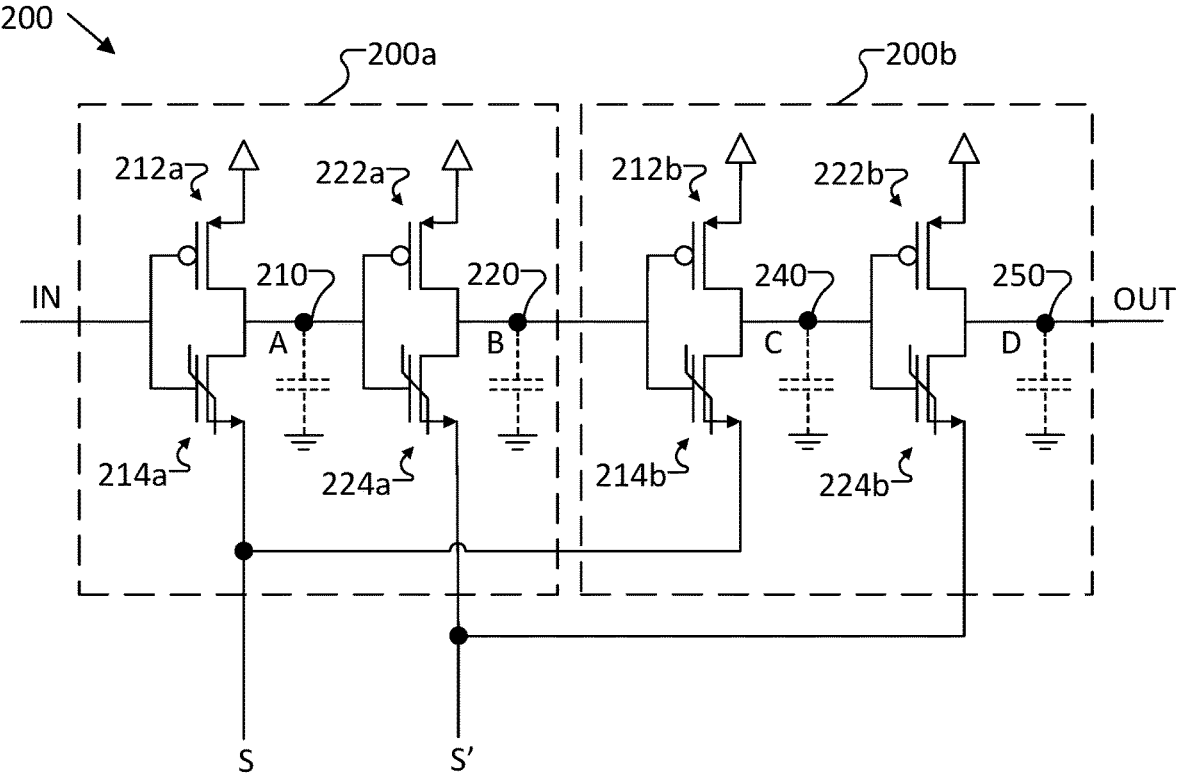
FIG. 2 shows in schematic view an exemplary programmable delay circuit.

While FIG. 1 may show a simple form of a programmable delay circuit (e.g., a pair of inverter circuits 101, 102 that are connected in series, each with a state-programmable memory element programmed to a different programming state), any number of such inverter pairs may be connected in series. For each additional inverter pair added in series, a corresponding delay associated with each added inverter pair may add to the overall delay of the programmable delay circuit. As shown with programmable delay circuit 200 of FIG. 2, for example, two inverter pairs (200*a* and 200*b*) may be connected in series, where the overall delay may be the delay provided by the first inverter pair 200*a* plus the delay provided by the second inverter pair 200*b*. As can be seen in FIG. 2, the first state-programmable memory element 214*a* of the first inverter pair 200*a* and the first state-program-mable memory element 214*b* of the second inverter pair 200*b* may share a common source node (e.g., S), while the second state-programmable memory element 224*a* of the first inverter pair 200*a* and the second state-programmable memory element 224*b* of the second inverter pair 200*b* may share a common source node (e.g., S'). This may ensure that both inverter pairs 200*a*, 200*b* are programmed to provide the same respective delay (e.g., to add a respective delay to either the rising edge or to the falling edge of the input signal). Of course, while a common programming signal (e.g., via a common source node S or S') may allow for efficient and consistent programming of multiple inverter pairs that are connected in series, it should be appreciated that each inverter may be programmed by an individual programming signal (e.g., each inverter need not be part of a common source programming node) or any number of programming signals.

Figure 3:
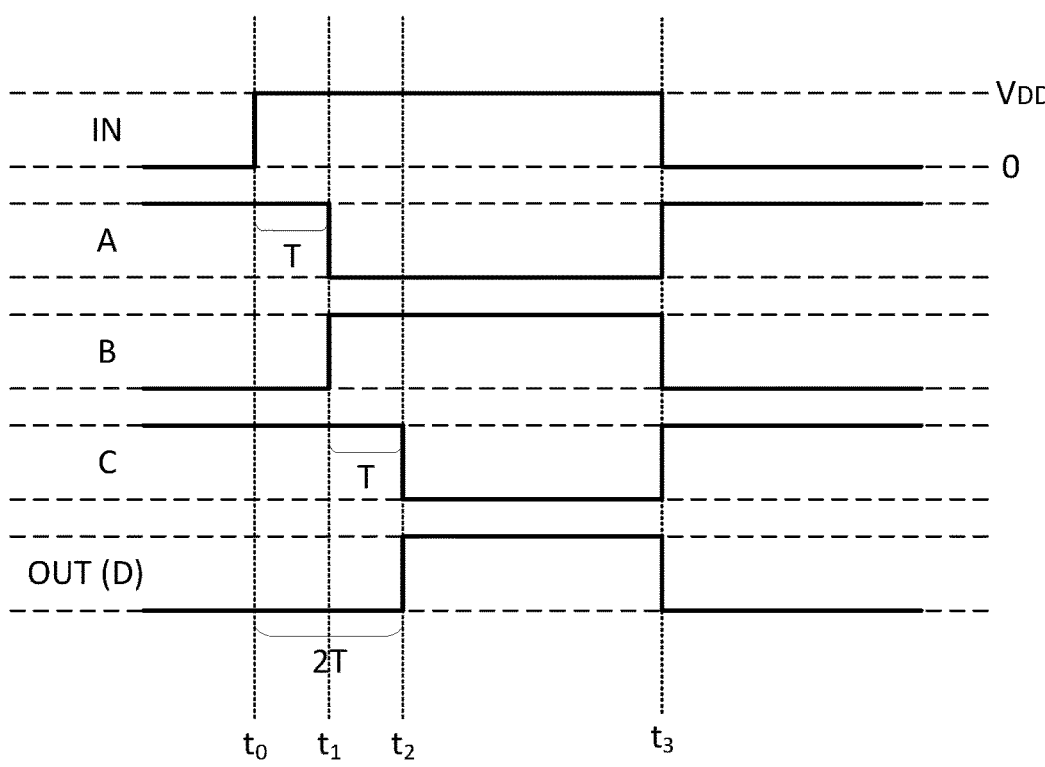
FIG. 3 shows an exemplary state diagram of a programmable delay circuit that may be configured to operate with an exemplary delay mode.
Figure 4:
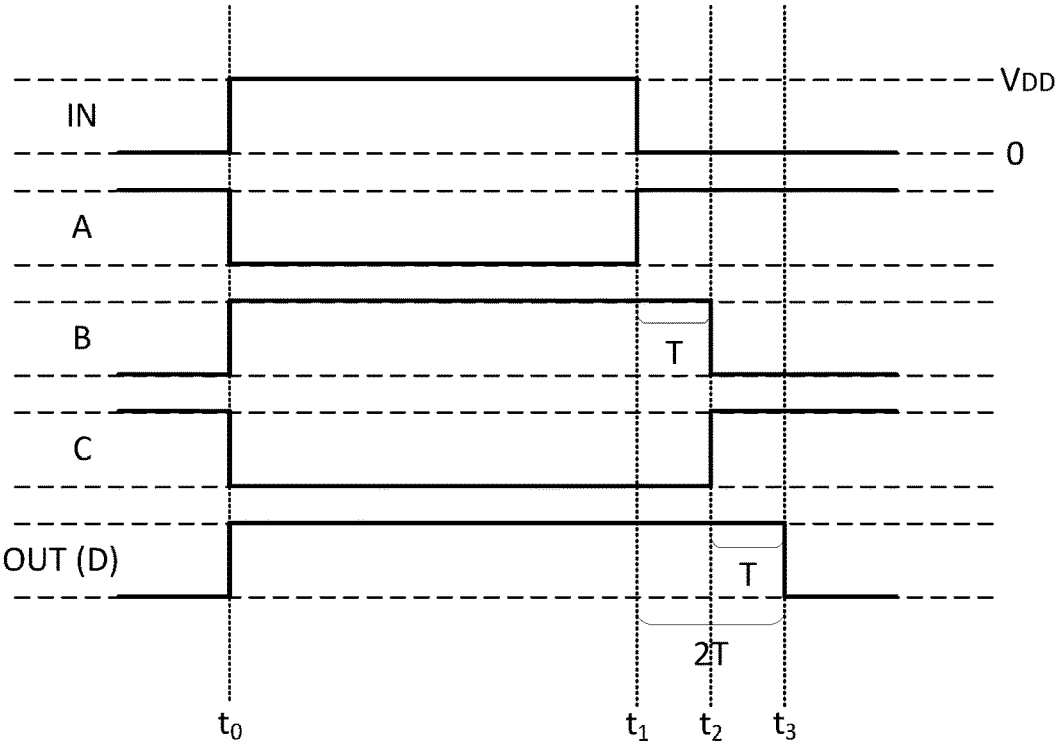
FIG. 4 shows an exemplary state diagram of a programmable delay circuit that may be configured to operate with another exemplary delay mode.

The operation and programming of programmable delay circuit 200 will be described below with respect to FIGS. 3 and 4. FIGS. 3 and 4 show exemplary timing diagrams for the programmable delay circuit 200 of FIG. 2. These timing diagrams show exemplary voltage levels that may be applied to the input signal (IN) as well as the corresponding/resulting voltages at the various nodes of the programmable delay circuit 200 (e.g., node A (at 210), node B (at 220), node C (at 240), and output node D (at 250) of FIG. 2). As depicted in the timing diagrams of FIGS. 3 and 4, zero volts may be understood as a logic low while $V_{DD}$ may be understood as a logic high, where $V_{DD}$ may be understood to be insufficient to program the state-programmable memory elements (e.g., state-programmable memory elements 214*a*, 214*b*, 224*a*, 224*b*). At the same time, $$\frac{3}{2}V_{DD}$$

may be understood to exceed a voltage sufficient to program the state-programmable memory elements (e.g., $$+\frac{3}{2}V_{DD}$$

to "program" to a first state and $$-\frac{3}{2}V_{DD}$$

to "erase" to a second state). As should be understood, these voltage levels are exemplary and other levels may be used.

For the timings shown in FIG. 3, it should be understood that the programmable delay circuit 200 has been programmed such that the first state-programmable memory elements 214*a*, 214*b* have been programmed to a first programming state associated with a weak ability to discharge its load capacitance (e.g., the first FeFET in each inverter pair is programmed to the HVT state), while state-programmable memory elements 224*a*, 224*b* have been programmed to a second programming state associated with a strong ability to discharge its load capacitance (e.g., the second FeFET in each inverter pair is programmed to the LVT state). In this configuration, programmable delay circuit 200 may provide a longer delay on a rising edge of the input signal as compared to a falling edge of the input signal. For example, at time $t_0$, the input to the first inverter circuit 200*a* is driven from zero to logic high (e.g., from zero to $V_{DD}$). Because the first state-programmable memory element 214*a* has been programmed to the first programming state associated with a weak ability to discharge its load capacitance at node A (at 210), there will be a time delay T for the voltage at node A to drop to low, from $t_0$ at time $t_1$. At that same time ($t_1$), because the second state-program-mable memory element 224*a* has been programmed to the second programming state associated with a strong ability to discharge its load capacitance, the voltage at node B (at 220), transitions to $V_{DD}$, essentially without an added delay.

The second inverter circuit 200*b* operates in a similar fashion, where it may take an additional time delay T for the voltage at node C (at 240) to drop to low (e.g., the time between time $t_1$ and $t_2$) because the first state-programmable memory element 214*b* has been programmed to the first programming state associated with a weak ability to dis-charge the load capacitance of node C. Finally, because the second state-programmable memory element 224*b* has been programmed to the second programming state associated with a strong ability to discharge its load capacitance, the voltage at node D (at 260) (e.g., at the drain of the second FeFET), transitions to $V_{DD}$ without additional delay. Thus, the total delay time from the input (IN) to the output (OUT) of programmable delay circuit 200 for the rising edge is 2T, while there is essentially no added time delay for the falling edge, as shown at $t_3$. (Of course, as should be appreciated, there may always be a nominal delay that is inherent in any logic element between its input and output, and the delay times discussed herein should be understood as referring to the programmable portion of the delay.)

For the timings shown in FIG. 4, it should be understood that the programmable delay circuit 200 has been pro-grammed differently than for the timings shown in FIG. 3, such that the second state-programmable memory elements 224*a*, 224*b* have been programmed to the first programming state associated with a weak ability to discharge its load capacitance (e.g., the second FeFET in each inverter pair is programmed to the HVT state), while the first state-pro-grammable memory elements 214*a*, 214*b* have been pro-grammed to the second programming state associated with a strong ability to discharge its load capacitance (e.g., the first FeFET in each inverter pair is programmed to the LVT state). In this configuration, programmable delay circuit 200 may provide a longer delay on a falling edge of the input signal as compared to its rising edge. For example, at time to, the input to the first inverter circuit 200*a* is driven from zero to logic high (e.g., a rising edge from zero to $V_{DD}$). Because the first state-programmable memory elements 214*a*, 214*b* have been programmed to the second program-ming state associated with a strong ability to discharge its load capacitance, the voltage at node A and node C will invert relatively quickly, essentially also at time to. Node B and node D are charged rapidly to $V_{DD}$ by the respective p-type FET 222*a*, 222*b*. On the falling edge of the input signal, at time $t_1$, node A will again invert relatively quickly. However, there will be a time delay T for the voltage at node B to invert (e.g., the time from $t_1$ to $t_2$) because the second state-programmable memory element 224*a* has been programmed to the first programming state associated with a weak ability to discharge the load capacitance of node D.

The second inverter circuit 200*b* operates in a similar fashion to the first inverter circuit 200*a*, where node C inverts relatively quickly after node B has inverted (i.e., at time $t_2$), charged through the p-type FET 212*b*. For node D, as with node B, there will be a time delay T for the voltage at node D to invert (e.g., the time from $t_2$ to $t_3$) because the second state-programmable memory element 224*b* has been programmed to the first programming state associated with a weak ability to discharge the load capacitance of node D. Thus, the total delay time from the input (IN) to the output (OUT) of programmable delay circuit 200 for the falling edge is 2T, while there is no added time delay for the rising edge.

Figures 5, 6A, 6B, 6C, 6D:
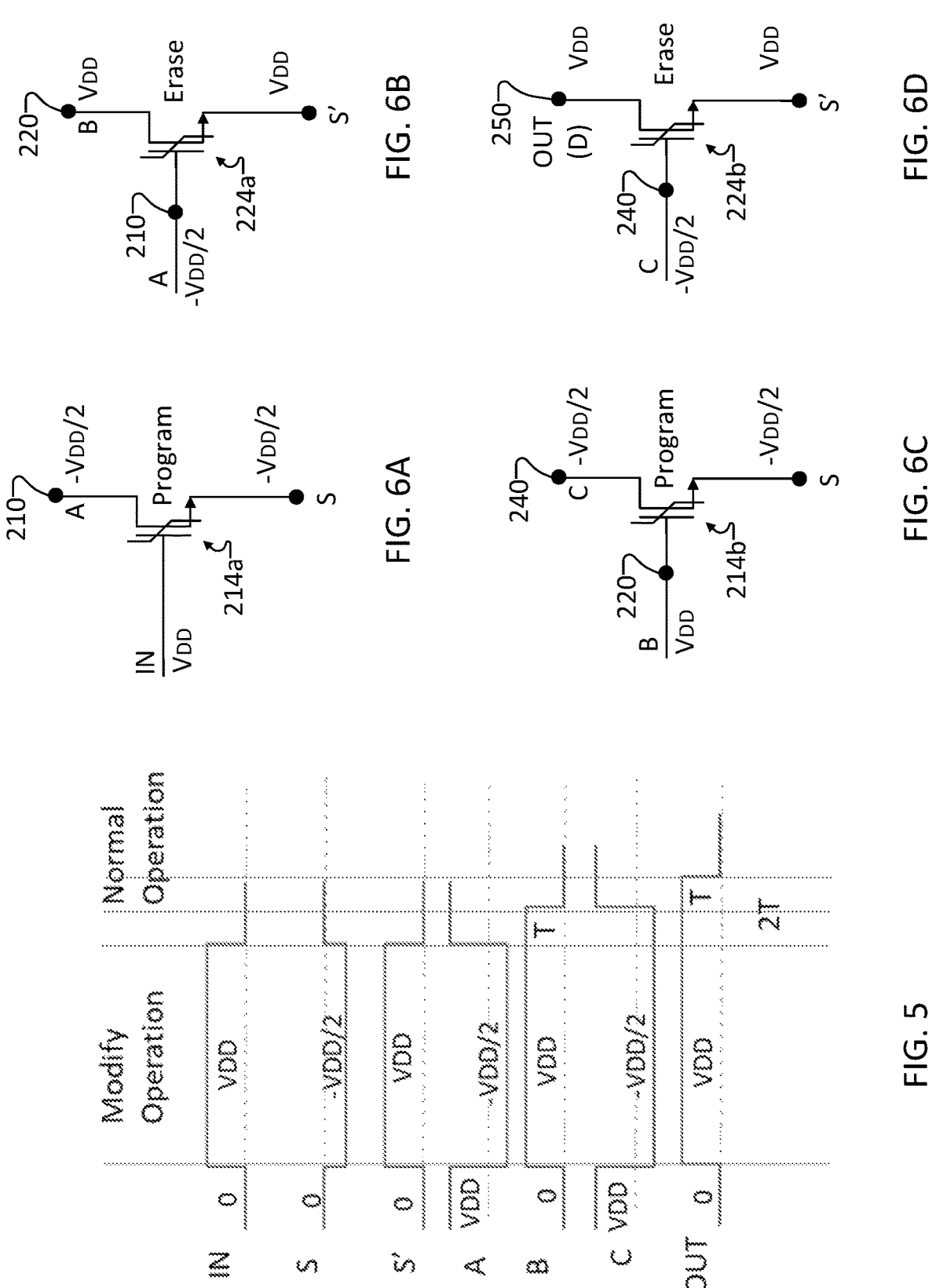
FIG. 5 shows an exemplary state diagram of programming a programmable delay circuit to operate with an exemplary delay mode.
FIGS. 6A-6D show in schematic view exemplary programmable delay circuits with exemplary voltage levels associated with FIG. 5, according to various aspects.

As noted earlier, it may be important that during normal operation the logic voltages (e.g., zero to $V_{DD}$, discussed above with respect to FIGS. 3-4) not exceed the programming voltages for the state-programmable memory elements so that the programmable delay circuit 200 provides a consistent delay during normal operation. However, in order to program the programmable delay circuit with the desired delay (e.g., to delay the rising edge or the falling edge), the voltage across each state-programmable memory element (e.g., the voltage from the gate to the source/drain of a FeFET) to be programmed must exceed the programming voltage associated with the particular programming state. To illustrate how such programming may be done for such a programmable delay circuit, reference is made to FIGS. 5 and 6A-6D, to show how programmable delay circuit 200 may be programmed to have a delay on the rising edge. In these figures, as with FIGS. 3-4, zero volts may be understood as a logic low while $V_{DD}$ may be understood as a logic high, where $V_{DD}$ may be understood to be insufficient to program the state-programmable memory elements (e.g., state-programmable memory elements 214*a*, 214*b*, 224*a*, 224*b*). At the same time, $$\frac{3}{2}V_{DD}$$

may be understood to exceed a voltage sufficient to program the state-programmable memory elements (e.g.

$$+\frac{3}{2}V_{DD}$$

to "program" to a second state and $$-\frac{3}{2}V_{DD}$$

to "erase" to a first state). As should be understood, these voltage levels are exemplary and other levels may be used. The timing diagram in FIG. 5 shows exemplary voltage levels that may be applied to the input signal (IN) and the programming signals (S and S') for programming the programmable delay circuit 200 to have a falling edge delay. FIG. 5 also shows the corresponding/resulting voltages at the various nodes of the programmable delay circuit 200 (e.g., nodes A, B, C, and output node D) during the programming operation and the normal operation. The first column shows the signals for the programming operation. Note that the column indicating the voltages for the programming operation is labeled "Modify Operation" to be more broadly include all programming, regardless of nomenclature (e.g., including an "erase" of a FeFET to the HVT state as well as a "program" of a FeFET to the LVT state). In this sense, the Modify Operation should be understood as applying a voltage across the state-programmable memory element such that it is programmed to a remanent state (e.g., a remanent polarization state). The circuit diagrams of FIGS. 6A-6D may be viewed in conjunction with FIG. 5 to understand the voltages at the various nodes of each state-programmable memory element of programmable delay circuit 200 during the modify operation of FIG. 5 that programs the programmable delay circuit 200 to have a falling edge delay. As should be appreciated, the labeling and reference numbering of the circuits in FIGS. 6A-6D are the same as that of circuit programmable delay circuit 200 of FIG. 2 so that the same label/reference number refers to the same element/node.

For the modify operation shown in FIG. 5, the programming signals S may be set to $$-\frac{1}{2}V_{DD}$$

and the input voltage (IN) may be driven to $V_{DD}$. As a result, as shown in FIGS. 6A and 6C, the voltage across each first state-programmable memory element 214*a*, 214*b* of each inverter circuit pair 200*a*, 200*b* may be $$+\frac{3}{2}V_{DD}$$

(e.g., the voltage drop from the gate to the source/drain (e.g., for state-programmable memory element 214*a*, this is the voltage drop from the input node to the source node S and to the drain node A at 210; for state-programmable memory element 214*b*, this is the voltage drop from node B at 220 to the source node S and to the drain node C at 240)). Because this voltage meets or exceeds the programming voltage (e.g., to "program" to the LVT state and its correspondingly strong ability to discharge the load capacitance), the state-programmable memory elements 214*a*, 214*b* are programmed to the second programmable state. At the same time, the programming signals S' may be set to $V_{DD}$ so that, as shown in FIGS. 6B and 6D, the voltage across each second state-programmable memory element 224*a*, 224*b* of each inverter circuit pair 200*a*, 200*b* may be $$-\frac{3}{2}V_{DD}$$

(e.g., the voltage drop from the gate to the source/drain (e.g., for state-programmable memory element 224*a*, this is the voltage drop from node A at 210 to the source node S' and to the drain node B at 220; for state-programmable memory element 224*b*, this is the voltage drop from node C at 240 to the source node S' and to the drain node D at 250)). Because this voltage meets or exceeds the programming voltage (e.g., to "erase" to the HVT state and its correspondingly weak ability to discharge the load capacitance), state-program-mable memory elements 224*a*, 224*b* are programmed to the first programmable state.

Once the modify operation is complete, the voltages at S and S' are returned to logic low (e.g., zero volts) so that the programmable delay circuit 200 may return to normal opera-tion. As can be seen in the Normal Operation column, the programmable delay circuit 200 provides a delay of 2T on the falling edge and essentially no delay on the rising edge, as discussed in more detail above with respect to FIG. 4.

Figures 7, 8A, 8B, 8C, 8D:
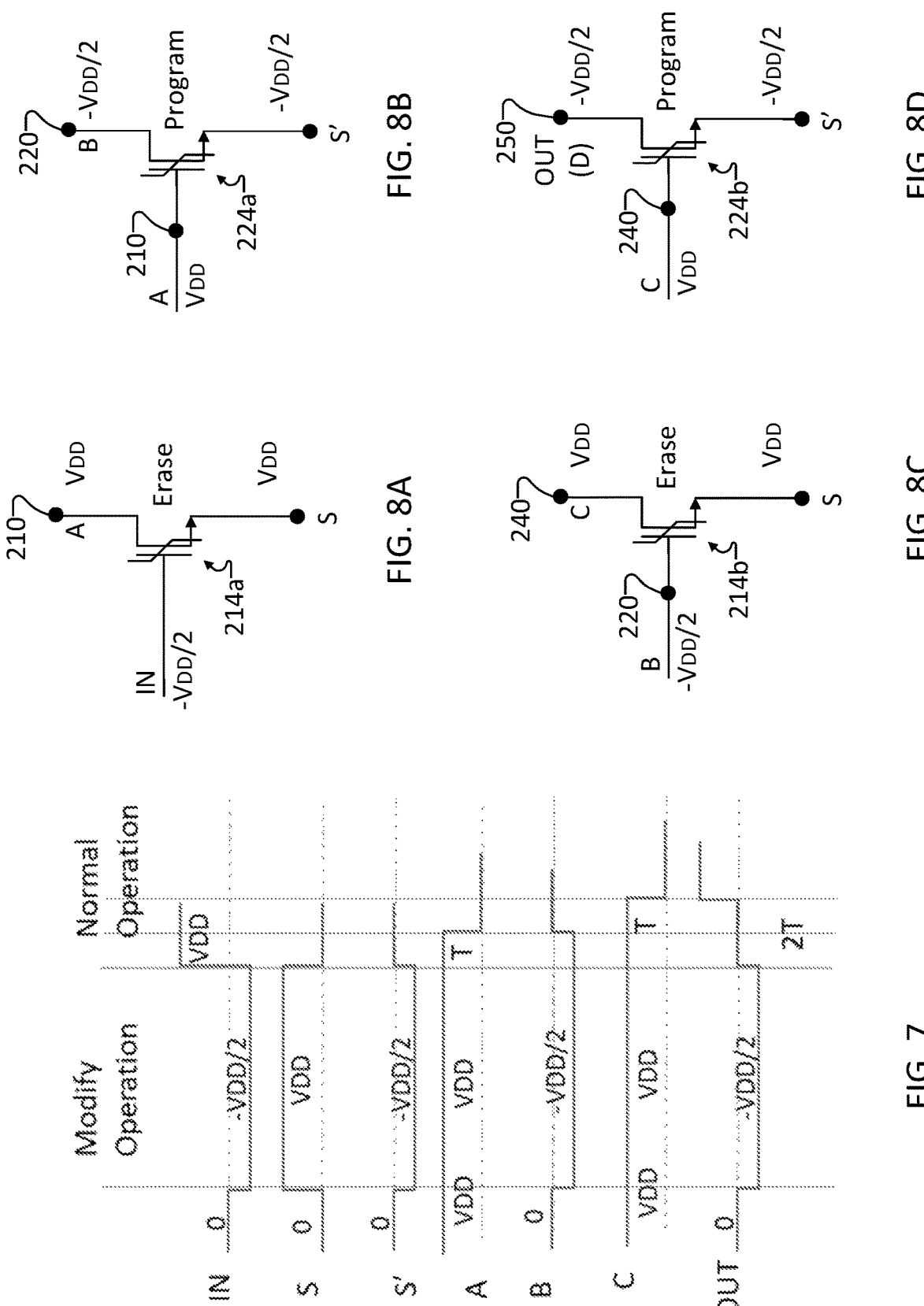
FIG. 7 shows an exemplary state diagram of programming a programmable delay circuit to operate with another exemplary delay mode.
FIGS. 8A-8D show in schematic view exemplary programmable delay circuit with exemplary voltage levels associated with FIG. 7, according to various aspects.

By contrast, the timing diagram in FIG. 7 shows exem-plary voltage levels that may be applied to the input signal (IN) and the programming signals (S and S') for program-ming the programmable delay circuit 200 to have a rising edge delay. FIG. 7 also shows the corresponding/resulting voltages at the various nodes of the programmable delay circuit 200 (e.g., nodes A, B, C, and output node D) during the programming operation and the normal operation. The first column shows the signals for the programming opera-tion. Note that the column indicating the voltages for the programming operation is labeled "Modify Operation" to be more broadly include all programming, regardless of nomenclature (e.g., including an "erase" of a FeFET to the HVT state as well as a "program" of a FeFET to the LVT state). In this sense, the Modify Operation should be under-stood as applying a voltage across the state-programmable memory element such that it is programmed to a remanent state (e.g., a remanent polarization state). The circuit dia-grams of FIGS. 8A-8D may be viewed in conjunction with FIG. 7 to understand the voltages at the various nodes of each state-programmable memory element of programmable delay circuit 200 during the modify operation of FIG. 7 that programs the programmable delay circuit 200 to have a rising edge delay. As should be appreciated, the labeling and reference numbering of the circuits in FIGS. 8A-8D are the same as that of circuit programmable delay circuit 200 of FIG. 2 so that the same label/reference number refers to the same element/node.

For the modify operation shown in FIG. 7, the program-ming signals S may be set to $V_{DD}$ and the input voltage (IN) may be driven to $$-\frac{1}{2}V_{DD}.$$

As a result, as shown in FIGS. 8A and 8C, the voltage across each first state-programmable memory element 214*a*, 214*b* of each inverter circuit pair 200*a*, 200*b* may be $$-\frac{3}{2}V_{DD}$$

(e.g., the voltage drop from the gate to the source/drain (e.g., for state-programmable memory element 214*a*, this is the voltage drop from the input node to the source node S and to the drain node A at 210; for state-programmable memory element 214*b*, this is the voltage drop from node B at 220 to the source node S and to the drain node C at 240)). Because this voltage meets or exceeds the programming voltage (e.g., to "erase" to the HVT state and its correspondingly weak ability to discharge the load capacitance), the state-program-mable memory elements 214*a*, 214*b* are programmed to the first programmable state. At the same time, the programming signals S' may be set to $$-\frac{1}{2}V_{DD}$$

so that, as shown in FIGS. 8B and 8D, the voltage across each second state-programmable memory element 224*a*, 224*b* of each inverter circuit pair 200*a*, 200*b* may be $$+\frac{3}{2}V_{DD}$$

(e.g., the voltage drop from the gate to the source/drain (e.g., for state-programmable memory element 224*a*, this is the voltage drop from node A at 210 to the source node S' and to the drain node B at 220; for state-programmable memory element 224*b*, this is the voltage drop from node C at 240 to the source node S' and to the drain node D at 250)). Because this voltage meets or exceeds the programming voltage (e.g., to "program" to the LVT state and its correspondingly strong ability to discharge the load capacitance), the state-program-mable memory elements 224*a*, 224*b* are programmed to the second programmable state.

Once the modify operation is complete, the voltages at S and S' are returned to logic low (e.g., zero volts) so that the programmable delay circuit 200 may return to normal opera-tion. As can be seen in the Normal Operation column, the programmable delay circuit 200 provides a delay of 2T on the rising edge and essentially no delay on the falling edge, as discussed in more detail above with respect to FIG. 3.

Figure 9:
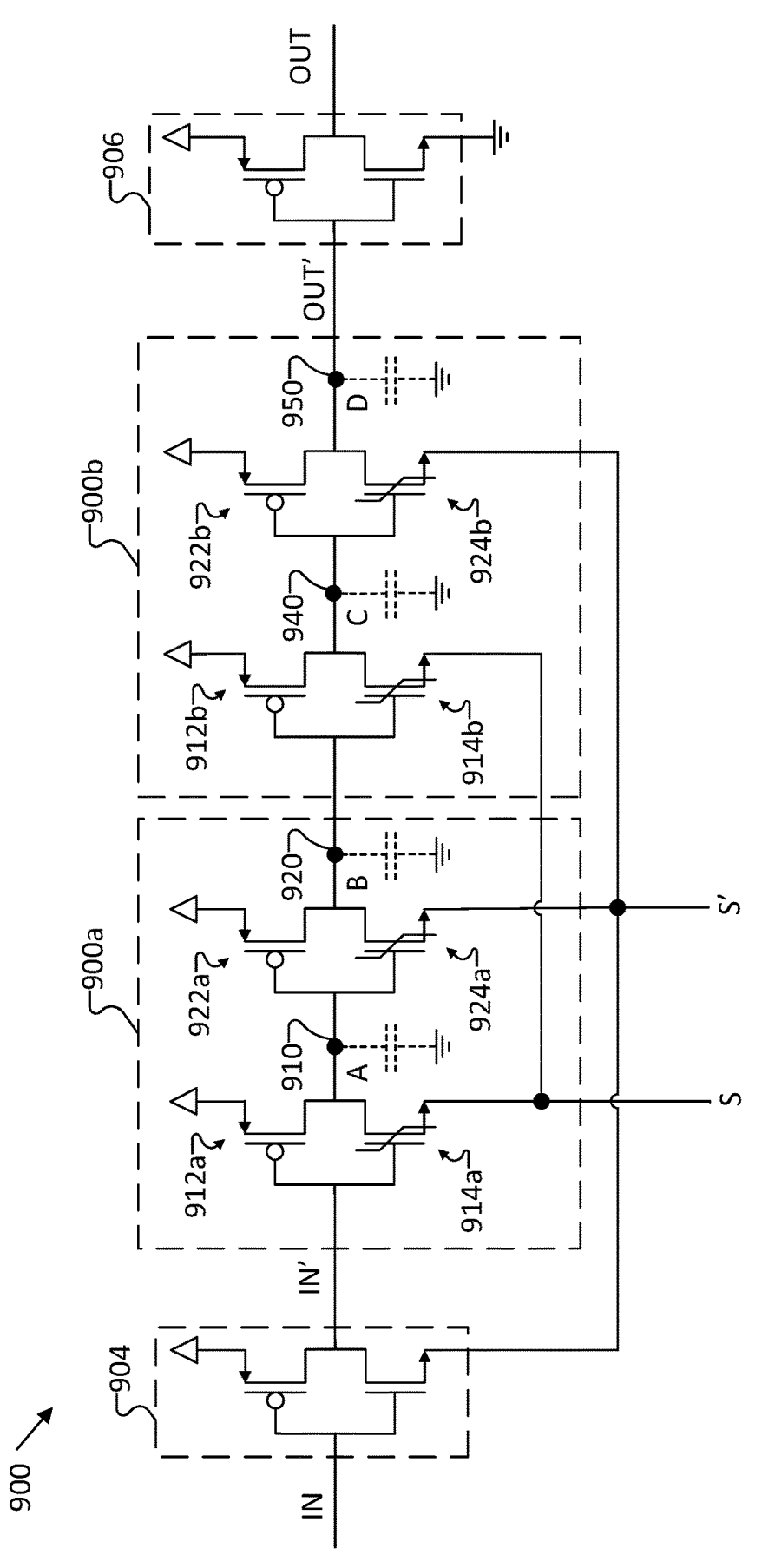
FIG. 9 shows an exemplary programmable delay circuit with level-limiting circuitry, according to various aspects.

FIG. 9 shows a programmable delay circuit 900 for providing a programmable delay to a signal applied to the input (e.g., "IN") by transmitting it to the output node (e.g., "OUT") after a time delay. Programmable delay circuit 900 may be an exemplary embodiment of the programmable delay circuit 100 and/or programmable delay circuit 200 described above, and this example of FIG. 9 is not intended to limit programmable delay circuits 100 or 200, which may be implemented in any number of ways. For convenience and consistency, the elements and nodes of FIG. 9 have been labeled with numbers that correspond to FIG. 2 (e.g., elements 912*a*, 912*b*, 922*a*, 922*b*, 914*a*, 914*b*, 924*a*, and 924*b*, and nodes 910, 920, 940, and 950 of FIG. 9 may correspond respectively to elements 212*a*, 212*b*, 222*a*, 222*b*, 214*a*, 214*b*, 224*a*, and 224*b*, and nodes 210, 220, 240, and 250 of FIG. 2).

Programmable delay circuit 900 may include two inverter pairs (first inverter pair 900*a* and second inverter pair 900*b*), which may function as described above with respect to programmable delay circuit 200 and its first inverter pair 200*a* and second inverter pair 200*b*. What distinguishes programmable delay circuit 900 from programmable delay circuit 200 is the addition of a pair of level-limiting inverter circuits 904, 906. Advantageously, the addition of level-limiting inverter circuits 904, 906 allows the input (IN) to and the output from (OUT) the programmable delay circuit 900 to remain within the range of zero to $V_{DD}$, even during a modify operation. This means that the input and the output need not be driven to levels that are different from logic low (e.g., zero volts) and logic high (e.g., $V_{DD}$). During normal operation, S and S' may still remain at zero volts, and the programmable delay circuit functions as described above for normal operation of programmable delay circuit 200. For the modify operation, however, the input (IN) need not be driven to $$-\frac{1}{2}V_{DD}$$

to set the delay to the rising edge (as in FIG. 7). Instead, IN' (e.g., the intermediate input node between level-limiting inverter circuit 904 and IN) may be driven to $$-\frac{1}{2}V_{DD}$$

when $$S' = -\frac{1}{2}V_{DD}$$

by driving IN=$V_{DD}$ (i.e., so that the pMOS side of level-limiting inverter circuit 904 is kept off). Similarly, to program the delay to the falling edge (as in FIG. 5), IN' may be driven to $V_{DD}$ when S'=$V_{DD}$ by driving IN to 0V. As a result, the voltage across the level-limiting inverter circuit 906 is always between zero volts and $V_{DD}$, keeping the voltage at output OUT within the range of zero to $V_{DD}$. In this sense, programmable delay circuit 900 may operate with the same voltages and timings for the modify operation as shown in FIG. 7 and FIGS. 8A-8D, with the understanding that IN' is substituted for IN and OUT' (e.g., the intermediate output node between level-limiting inverter circuit 906 and OUT) is substituted for OUT. As a result, the input voltage IN and output voltage OUT may remain within the range of logic low (e.g., zero volts) and logic high (e.g., $V_{DD}$), even during a modify operation. While FIG. 9 has been described with respect to a two pairs of inverter circuits (e.g., first inverter pair 900a and second inverter pair 900b), it should be appreciated that any number of inverter pairs may be used between level-limiting inverter circuits 904, 906 (e.g., a single pair as shown in FIG. 1, more than 2 pairs, etc.).

FIG. 10 depicts an exemplary schematic flow diagram of a method 1000 for operating a programmable delay circuit. Method 1000 may implement any of the features and/or structures described above with respect to the programmable delay circuits described above with respect to FIGS. 1-9.

Method 1000 includes, in 1010, receiving a programming signal to program a pair of inverter circuits to a first delay mode or a second delay mode, wherein at least one inverter of the pair of inverter circuits comprises a state-programmable memory element. Method 1000 also includes, in 1020, receiving an input signal at the programmable delay circuit. Method 1000 also includes, in 1030, providing the input signal with a delay to an output node, wherein the delay depends on whether the pair of inverter circuits is programmed to the first delay mode or the second delay mode.

In the following, various examples are provided that may include one or more aspects described above with reference to a programmable delay circuit (e.g., programmable delay circuit 100, 200, 900, method 1000 and/or FIGS. 1-10). It may be intended that aspects described in relation to the circuits may apply also to the described method(s), and vice versa.

Example 1 is a programmable delay circuit including an input node, an output node, and a pair of inverter circuits coupled in series between the input node and the output node, wherein the pair of inverter circuits is configured to provide an adjustable delay for a signal transmitted from the input node to the output node. The pair of inverter circuits includes at least one state-programmable memory element that allows the pair of inverter circuits to be configurable between a first delay mode or a second delay mode.

Example 2 is the programmable delay circuit of example 1, wherein if the pair of inverter circuits is programmed to the first delay mode, the adjustable delay includes a first delay, and if the pair of inverter circuits is programmed to the second delay mode, the adjustable delay includes a second delay, where in the first delay is different from the second delay.

Example 3 is the programmable delay circuit of example 2, wherein the first delay includes a rising edge delay to a rising edge of the signal, wherein the second delay includes a falling edge delay to a falling edge of the signal.

Example 4 is the programmable delay circuit of example 2, wherein the first delay includes a rising edge delay to only a rising edge of the signal, wherein the second delay includes a falling edge delay only to a falling edge of the signal.

Example 5 is the programmable delay circuit of example 2, wherein the first delay includes a rising edge delay to the rising edge of the signal or a falling edge delay to a falling edge of the signal, wherein the second delay mode includes no additional delay to the signal.

Example 6 is the programmable delay circuit of any one of examples 1 to 5, wherein the pair of inverter circuits configurable between the first delay mode and the second delay mode includes the at least one state-programmable memory element of the pair of inverter circuits configured to be programmed to a first programming state or a second programming state.

Example 7 is the programmable delay circuit of any one of examples 1 to 6, wherein the pair of inverter circuits configurable between the first delay mode and the second delay mode includes the at least one state-programmable memory element of the pair of inverter circuits configured to be programmed to one of either a first programming state or a second programming state, and a second state-programmable memory element of the pair of inverter circuits configured to be programmed to another of either the first programming state or the second programming state.

Example 8 is the programmable delay circuit of example 7, wherein the first programming state and the second programming state include different spontaneously polarizable states of the at least one state-programmable memory element.

Example 9 is the programmable delay circuit of example 8, wherein the first programming state includes a high threshold voltage state of a spontaneously polarizable field-effect transistor and the second programming state includes a low threshold voltage state of the spontaneously polarizable field-effect transistor.

Example 10 is the programmable delay circuit of either of examples 8 or 9, wherein the at least one state-programmable memory element includes a spontaneously polarizable field-effect transistor, wherein the first programming state corresponds to a first charge time at a drain of the spontaneously polarizable field-effect transistor and the second programming state corresponds to a second charge time of the spontaneously polarizable field-effect transistor, wherein the first charge time is different from the second charge time.

Example 11 is the programmable delay circuit of example 7, wherein the pair of inverter circuits configured to be programmed to the first programming state or the second programming state includes at least one state programmable memory element configured to be programmable to at least two distinct remanent polarization states based on a voltage across the at least one programmable memory element.

Example 12 is the programmable delay circuit of any one of examples 1 to 11, wherein the at least one inverter circuit that includes the at least one state-programmable memory element includes: a p-type spontaneously polarizable field-effect transistor connected with an n-type field-effect transistor; a p-type field-effect transistor connected with an n-type spontaneously polarizable field-effect transistor; or a p-type spontaneously polarizable field-effect transistor connected with an n-type spontaneously polarizable field-effect transistor.

Example 13 is the programmable delay circuit of any one of examples 1 to 12, wherein the pair of inverter circuits are configurable between the first delay mode or the second delay mode by a programming operation that is based on a programming signal. The programming signal may be configured to program the at least one state-programmable memory element to one of either a first programming state or a second programming state.

Example 14 is the programmable delay circuit of example 13, wherein the programming operation is configured to cause a voltage drop across the at least one state-programmable memory element, wherein the voltage drop is sufficient to program the at least one state-programmable memory element to one of either the first programming state or the second programming state.

Example 15 is the programmable delay circuit of example 14, wherein a magnitude of a predefined voltage range for the signal is lower than a magnitude of the voltage drop.

Example 16 is the programmable delay circuit of any one of examples 1 to 15, further including a first level-limiting circuit connected at an intermediate input node between the input node and the pair of inverter circuits, and a second level-limiting circuit connected at an intermediate output node between the second inverter circuit and the output node.

Example 17 is the programmable delay circuit of example 16, wherein the first level-limiting circuit is configured to decouple an input voltage level at the input node from a programming voltage level at the intermediate input node.

Example 18 is the programmable edge delay circuit of either of examples 16 or 17, wherein the second level-limiting circuit is configured to decouple an output voltage level at the output node from a programming voltage level at the intermediate output node.

Example 19 is the programmable delay circuit of any one of examples 14 to 18, wherein the pair of inverter circuits includes a first inverter circuit and a second inverter circuit, wherein the first inverter circuit includes the at least one state-programmable memory element and the second inverter circuit includes a second state-programmable memory element, wherein the programming operation is further configured to cause a voltage drop across the second state-programmable memory element, wherein the voltage drop across the second state-programmable memory element is sufficient to program the second state-programmable memory element to another of either the first programming state or the second programming state.

Example 20 is the programmable delay circuit of any one of examples 1 to 19, further including a second pair of inverter circuits coupled in series between the pair of inverter circuits and the output node, wherein the second pair of inverter circuits is configured to provide an additional adjustable delay for the signal transmitted from the input node to the output node, wherein the second pair of inverter circuits includes a corresponding at least one state-programmable memory element that allows the second pair of inverter circuits to be configurable between the first delay mode or the second delay mode.

Example 21 is the programmable delay circuit of example 20, wherein the pair of inverter circuits and second pair of inverter circuits are configurable together between the first delay mode or the second delay mode by a programming operation that is based on a programming signal, where the programming operation is configured to program the at least one state-programmable memory element of the pair of inverter circuits and the corresponding at least one state-programmable memory element of the second pair of inverter circuits to one of either a first programming state or a second programming state.

Example 22 is a programmable edge delay circuit including an input node configured to receive an input signal, an output node configured to provide as an output signal a delayed version of the input signal, a first inverter circuit connected to the input node that includes a first state-programmable field-effect transistor that is programmable to a first state or a second state, and a second inverter circuit connected between the first inverter circuit and the output node, wherein the second inverter circuit includes a second state-programmable field-effect transistor that is programmable to the first state or the second state, wherein if the first state-programmable field-effect transistor is programmed to the first state and the second state-programmable field-effect transistor is programmed to the second state, the delayed version of the input signal is the input signal with a timing delay on a rising edge of the input signal, wherein if the first state-programmable field-effect transistor is programmed to the second state and the second state-programmable field-effect transistor is programmed to the first state, the delayed version of the input signal includes the input signal with a timing delay on a falling edge of the input signal.

Example 23 is the programmable edge delay circuit of example 22, wherein the first state-programmable field-effect transistor and the second state-programmable field-effect transistor each include a ferroelectric field-effect transistor.

Example 24 is the programmable edge delay circuit of either of examples 22 or 23, wherein the first state is a high voltage threshold state of the at least one state-programmable field-effect transistor and the second state is a low voltage threshold state of the at least one state-programmable field-effect transistor, wherein the at least one state-programmable field-effect transistor includes an n-type spontaneously polarizable field-effect transistor.

Example 25 is the programmable edge delay circuit of either of examples 22 or 23, wherein the first state is a low voltage threshold state of the at least one state-programmable field-effect transistor and the second state is a high voltage threshold state of the at least one state-programmable field-effect transistor, wherein the at least one state-programmable field-effect transistor includes a p-type spontaneously polarizable field-effect transistor.

Example 26 is the programmable edge delay circuit of any one of examples 22 to 25, wherein each of the first state-programmable field-effect transistor and the second state-programmable field-effect transistor is programmable between the first state or the second state based on a voltage of a programming signal.

Example 27 is the programmable edge delay circuit of any one of examples 22 to 26, wherein the voltage of the programming signal is configured to cause a voltage drop across the first state-programmable field-effect transistor or the second state-programmable field-effect transistor, wherein the voltage drop is sufficient to program the first state or the second state.

Example 28 is the programmable edge delay circuit of any one of examples 22 to 27, wherein the first inverter circuit is connected in series with the second inverter circuit.

Example 29 is the programmable edge delay circuit of either of examples 27 or 28, wherein a magnitude of a predefined voltage range for the input signal is lower than a magnitude of the voltage drop.

Example 30 is the programmable edge delay circuit of any one of examples 22 to 29, further including a first level-limiting circuit connected at an intermediate input node between the input node and the first inverter circuit, and a second level-limiting circuit connected at an intermediate output node between the second inverter circuit and the output node.

Example 31 is the programmable edge delay circuit of example 30, wherein the first level-limiting circuit is configured to decouple an input voltage level at the input node from a programming voltage level at the intermediate input node.

Example 32 is the programmable edge delay circuit of either of examples 30 or 31, wherein the second level-limiting circuit is configured to decouple an output voltage level at the output node from a programming voltage level at the intermediate output node.

Example 33 is the programmable edge delay circuit of any one of examples 22 to 32, further including a third inverter circuit corresponding to the first inverter circuit, further including a fourth inverter circuit corresponding to the second inverter circuit, wherein the third inverter circuit includes a third state-programmable field-effect transistor that is programmable to the first state or the second state, wherein the fourth inverter circuit includes a fourth state-programmable field-effect transistor that is programmable to the first state or the second state, wherein if the first state-programmable field-effect transistor is programmed to the first state, the third state-programmable field-effect transistor is also configured to the first state, and if the first state-programmable field-effect transistor is programmed to the second state, the third state-programmable field-effect transistor is also configured to the second state, wherein if the second state-programmable field-effect transistor is programmed to the first state, the fourth state-programmable field-effect transistor is also configured to the first state, and if the second state-programmable field-effect transistor is programmed to the second state, the fourth state-programmable field-effect transistor is also configured to the second state.

Example 34 is a method for operating a programmable delay circuit, the method including receiving a programming signal to program a pair of inverter circuits to a first delay mode or a second delay mode, wherein at least one inverter of the pair of inverter circuits includes a state-programmable memory element. The method also includes receiving an input signal at the programmable delay circuit. The method also includes providing the input signal with a delay to an output node, wherein the delay depends on whether the pair of inverter circuits is programmed to the first delay mode or the second delay mode.

Example 35 is the method of example 34, wherein if the pair of inverter circuits is programmed to the first delay mode, the adjustable delay includes a first delay, and if the pair of inverter circuits is programmed to the second delay mode, the adjustable delay includes a second delay, where in the first delay is different from the second delay.

Example 36 is the method of example 35, wherein the first delay includes a rising edge delay to a rising edge of the input signal, wherein the second delay includes a falling edge delay to a falling edge of the input signal.

Example 37 is the method of example 35, wherein the first delay includes a rising edge delay to only a rising edge of the input signal, wherein the second delay includes a falling edge delay only to a falling edge of the input signal.

Example 38 is the method of example 35, wherein the first delay includes a rising edge delay to the rising edge of the input signal or a falling edge delay to a falling edge of the input signal, wherein the second delay includes no additional delay to the input signal.

Example 39 is the method of any one of examples 34 to 38, wherein the at least one inverter is programmable to the first delay mode or the second delay mode by programming the at least one state-programmable memory element to either a first programming state or a second programming state.

Example 40 is the method of any one of examples 34 to 39, further including programming the pair of inverter circuits based on the programming signal, wherein programming the first delay mode includes programming the at least one state-programmable memory element of the pair of inverter circuits to one of either a first programming state or a second programming state, and programming a second state-programmable memory element of the pair of inverter circuits configured to another of either the first programming state or the second programming state.

Example 41 is the method of example 40, wherein the first programming state and the second programming state include different spontaneously polarizable states of the at least one state-programmable memory element.

Example 42 is the method of example 41, wherein the first programming state includes a high threshold voltage state of a spontaneously polarizable field-effect transistor and the second programming state includes a low threshold voltage state of the spontaneously polarizable field-effect transistor.

Example 43 is the method of either of examples 41 or 42, wherein the at least one state-programmable memory element includes a spontaneously polarizable field-effect transistor, wherein the first programming state corresponds to a first charge time at a drain of the spontaneously polarizable field-effect transistor and the second programming state corresponds to a second charge time of the spontaneously polarizable field-effect transistor, wherein the first charge time is different from the second charge time.

Example 44 is the method of example 40, wherein programming the first programming state or the second programming state includes programming the at least one state programmable memory element to at least one of two distinct remanent polarization states based on a voltage across the at least state programmable memory element.

Example 45 is the method of any one of examples 34 to 44, wherein the at least one inverter circuit that includes the at least one state-programmable memory element includes: a p-type spontaneously polarizable field-effect transistor connected with an n-type field-effect transistor; a p-type field-effect transistor connected with an n-type spontaneously polarizable field-effect transistor; or a p-type spontaneously polarizable field-effect transistor connected with an n-type spontaneously polarizable field-effect transistor.

Example 46 is the method of any one of examples 34 to 45, further including programming, with the programming signal, the at least one state-programmable memory element to one of either a first programming state or a second programming state.

Example 47 is the method of example 46, wherein the programming signal causes a voltage drop across the at least one state-programmable memory element, wherein the voltage drop is sufficient to program the at least one state-programmable memory element to the first programming state or the second programming state.

Example 48 is the method of example 47, wherein a magnitude of a predefined voltage range for the input signal is lower than a magnitude of the voltage drop.

Example 49 is the method of example 48, wherein programming signal does not exceed the magnitude of the predefined voltage range when the programming signal causes the voltage drop.

The terms "at least one" and "one or more" may be understood to include any integer number greater than or equal to one, i.e., one, two, three, four, [ . . . ], etc. The term "a plurality" or "a multiplicity" may be understood to include any integer number greater than or equal to two, i.e., two, three, four, five, [ . . . ], etc. The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of listed elements.

The term "connected" may be used herein with respect to nodes, terminals, integrated circuit elements, and the like, to mean electrically connected, which may include a direct connection or an indirect connection, wherein an indirect connection may only include additional structures in the current path that do not influence the substantial functioning of the described circuit or device. The term "electrically conductively connected" that is used herein to describe an electrical connection between one or more terminals, nodes, regions, contacts, etc., may be understood as an electrically conductive connection with, for example, ohmic behavior, e.g., provided by a metal or degenerate semiconductor in absence of p-n junctions in the current path. The term "electrically conductively connected" may be also referred to as "galvanically connected".

While the invention has been particularly shown and described with reference to specific aspects, it should be understood by those skilled in the art that various changes in form and detail may be made therein without departing from the spirit and scope of the invention as defined by the appended claims. The scope of the invention is thus indicated by the appended claims and all changes, which come within the meaning and range of equivalency of the claims, are therefore intended to be embraced.

The invention claimed is:

1. A programmable edge delay circuit comprising:
an input node configured to receive an input signal;
an output node configured to provide as an output signal a delayed version of the input signal;
a first inverter circuit connected to the input node, wherein the first inverter circuit comprises a first state-programmable field-effect transistor that is programmable to a first remanent polarization state or a second remanent polarization state different from the first remanent polarization state; and
a second inverter circuit connected between the first inverter circuit and the output node, wherein the second inverter circuit comprises a second state-programmable field-effect transistor that is programmable to the first remanent polarization state or the second remanent polarization state,
wherein the first state-programmable field-effect transistor is in the first remanent polarization state and the second state-programmable field-effect transistor is in the second remanent polarization state,
wherein a longer timing delay is provided on one edge of the input signal while providing a shorter delay on the other edge of the input signal.

2. The programmable delay circuit of claim 1, wherein the first and second inverter circuits comprise: a p-type spontaneously polarizable field-effect transistor connected with an n-type field-effect transistor, wherein the p-type spontaneously polarizable field-effect transistor comprises the first or the second state-programmable memory element; a p-type field-effect transistor connected with an n-type spontaneously polarizable field-effect transistor, wherein the n-type spontaneously polarizable field-effect transistor comprises the first or the second state-programmable memory element; or a p-type spontaneously polarizable field-effect transistor connected with an n-type spontaneously polarizable field-effect transistor, wherein the p-type spontaneously polarizable field-effect transistor comprises the first state-programmable memory element and the n-type spontaneously polarizable field-effect transistor comprises the second state-programmable memory element.

3. The programmable delay circuit of claim 1, further comprising a first level-limiting circuit connected at an intermediate input node between the input node and the first and second inverter circuits, and a second level-limiting circuit connected at an intermediate output node between one inverter circuit of the first and second inverter circuits and the output node.

4. The programmable delay circuit of claim 3, wherein the first level-limiting circuit is configured to decouple an input voltage level at the input node from a programming voltage level at the intermediate input node; and/or wherein the second level-limiting circuit is configured to decouple an output voltage level at the output node from a programming voltage level at the intermediate output node.

5. The programmable delay circuit of claim 1, further comprising an additional pair of inverter circuits coupled in series between the first and second inverter circuits and the output node, wherein the additional pair of inverter circuits is configurable to provide an additional adjustable delay for the signal transmitted from the input node to the output node.

6. The programmable edge delay circuit of claim 1, wherein the first state-programmable field-effect transistor and the second state-programmable field-effect transistor each comprise a ferroelectric field-effect transistor.

7. The programmable edge delay circuit of claim 1, wherein the first remanent polarization state is a high voltage threshold state, and the second remanent polarization state is a low voltage threshold state.

8. A method for operating a programmable delay circuit according to claim 1, the method comprising:
receiving a programming signal at the input node to program the first and second inverter circuits; and receiving an input signal at the input node of the programmable edge delay circuit; and providing the input signal with a delay to an output node.

\* \* \* \* \*